United States Patent [19]

Kindl et al.

[11] Patent Number: 4,911,786
[45] Date of Patent: Mar. 27, 1990

[54] METHOD OF ETCHING POLYIMIDES AND RESULTING PASSIVATION STRUCTURE

[75] Inventors: Thomas E. Kindl, Endwell; Paul G. Rickerl, Endicott; David J. Russell, Apalachin, all of N.Y.

[73] Assignee: International Business Machines Corporation, Armonk, N.Y.

[21] Appl. No.: 343,217

[22] Filed: Apr. 26, 1989

[51] Int. Cl.⁴ .................. B44C 1/22; B29C 37/00; C03C 15/00; C23F 1/02
[52] U.S. Cl. .................. 156/659.1; 156/652; 156/655; 156/656; 156/661.1; 156/666; 156/668; 156/904; 430/317; 430/318
[58] Field of Search ............... 156/650, 651, 652, 655, 156/656, 659.1, 661.1, 664, 666, 668, 904; 427/96, 307; 430/313, 317, 318

[56] References Cited

U.S. PATENT DOCUMENTS

| | | | |
|---|---|---|---|
| 3,833,436 | 9/1974 | Hills et al. | 156/668 X |
| 4,426,253 | 1/1984 | Kreuz et al. | 156/668 |
| 4,436,583 | 3/1984 | Saiti et al. | 156/659.1 |
| 4,523,976 | 6/1985 | Buthman | 156/643 |
| 4,606,998 | 8/1986 | Clodgo et al. | 430/312 |

*Primary Examiner*—William A. Powell

[57] ABSTRACT

A method of etching polyimide having metallization patterned thereon in which an epoxy resin system provides the etch mask for etching the polyimide and provides a resulting passivation structure overlying the metallization. The polyimide having a metallization pattern thereon is coated with the photoimageable material resists concentrated KOH etching when the epoxy is cured and adheres to the polyimide and the metallized pattern after the KOH etch providing passivation to the metallization. The process includes exposing the layer of photoimageable material to radiation to selectively pattern the material, developing the patterned material revealing the underlying polyimide to be etched, curing the remaining material and etching the revealed polyimide in concentrated KOH to remove the revealed polyimide. The remaining epoxy firmly adheres as a passivation layer for the metallization. Preferably the epoxy consists by weight essentially of from about 10% to about 80% of a polyol resin which is a condensation product of epichlorohydrin and bisphenol A having a molecular weight of between about 40,000 to 130,00, and between about 20% and 90% of an epoxidized octafunctional bisphenol A formaldehyde novolak resin, having a molecular weight of between 4,000 to 10,000 and about 0.1 to about 15 parts of a cationic photoinitiator capable of initiating polymerization of resin exposed to radiation. The resin may contain up to about 50% of epoxidized di-glycidal ether of tetrabromo bisphenol A having a molecular weight of between about 600 and 2,500, for flame retardancy.

7 Claims, 5 Drawing Sheets

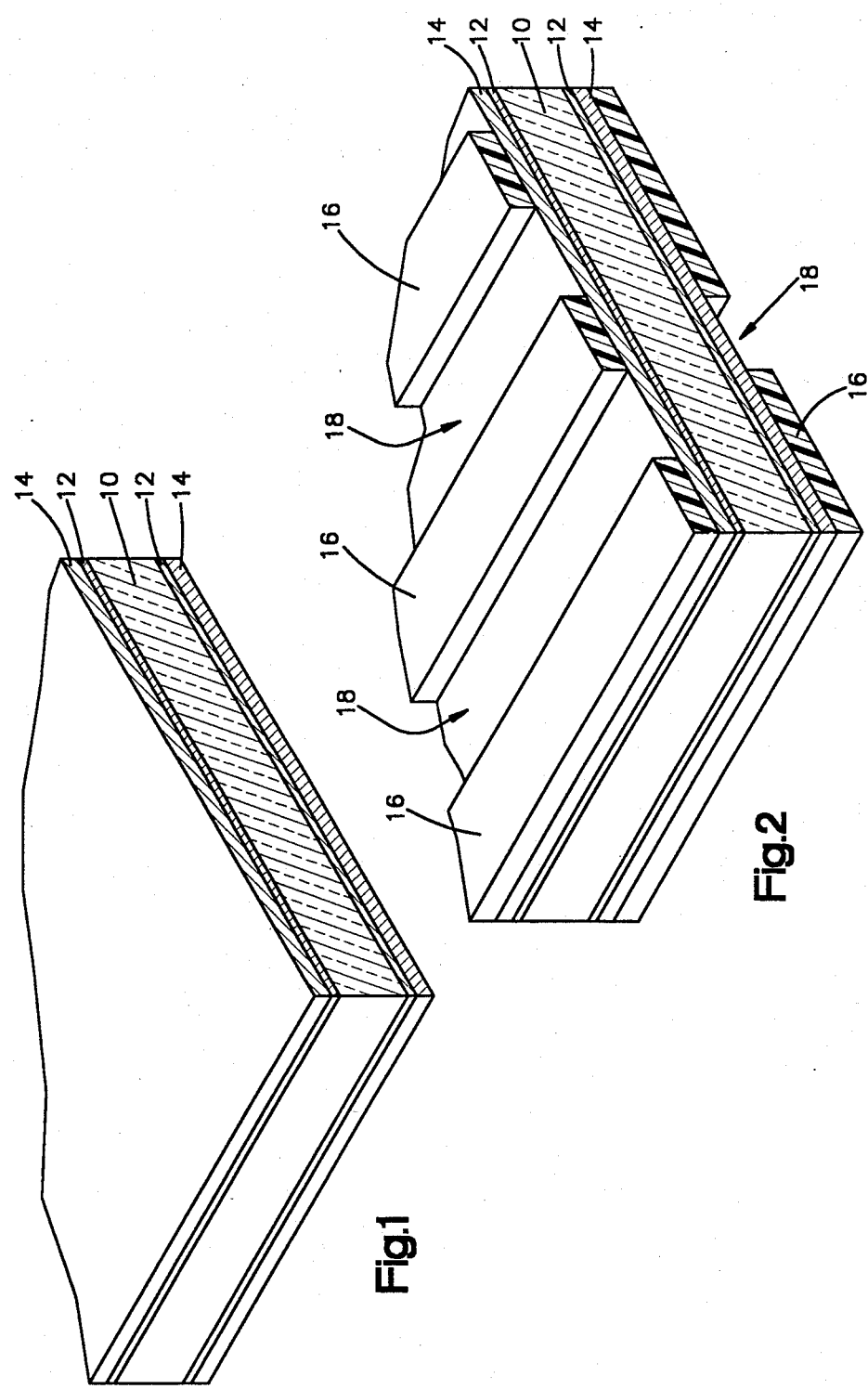

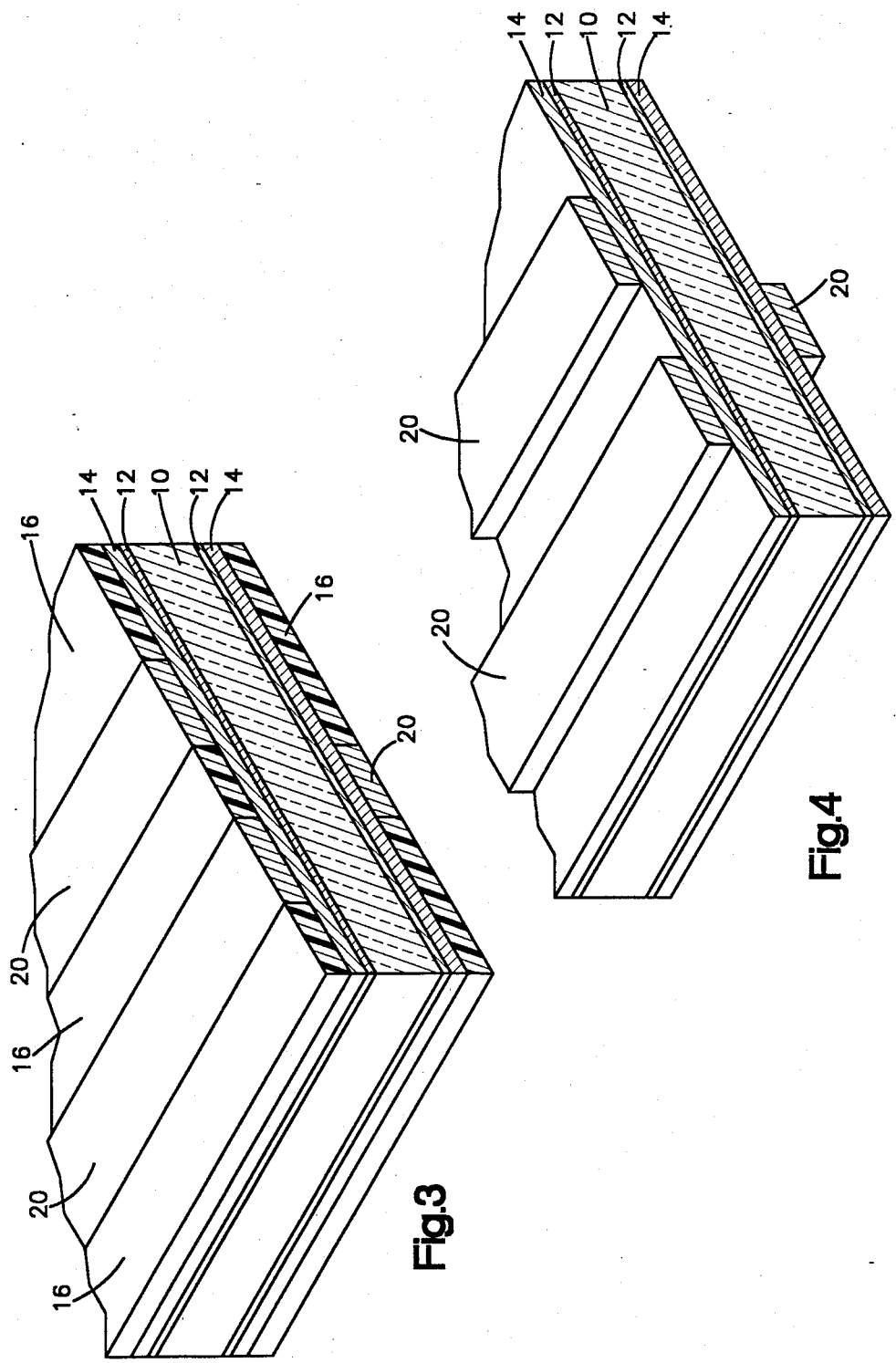

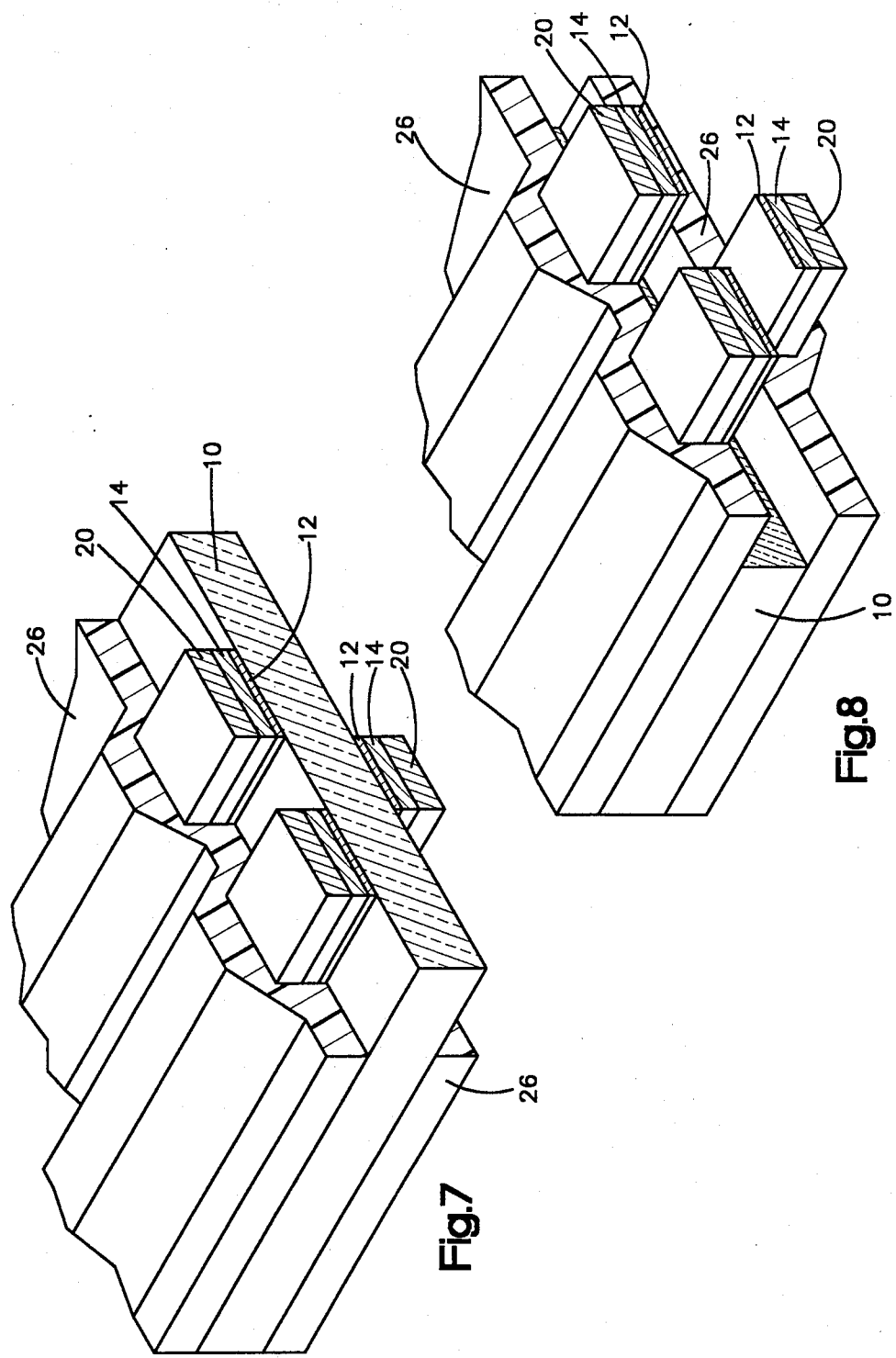

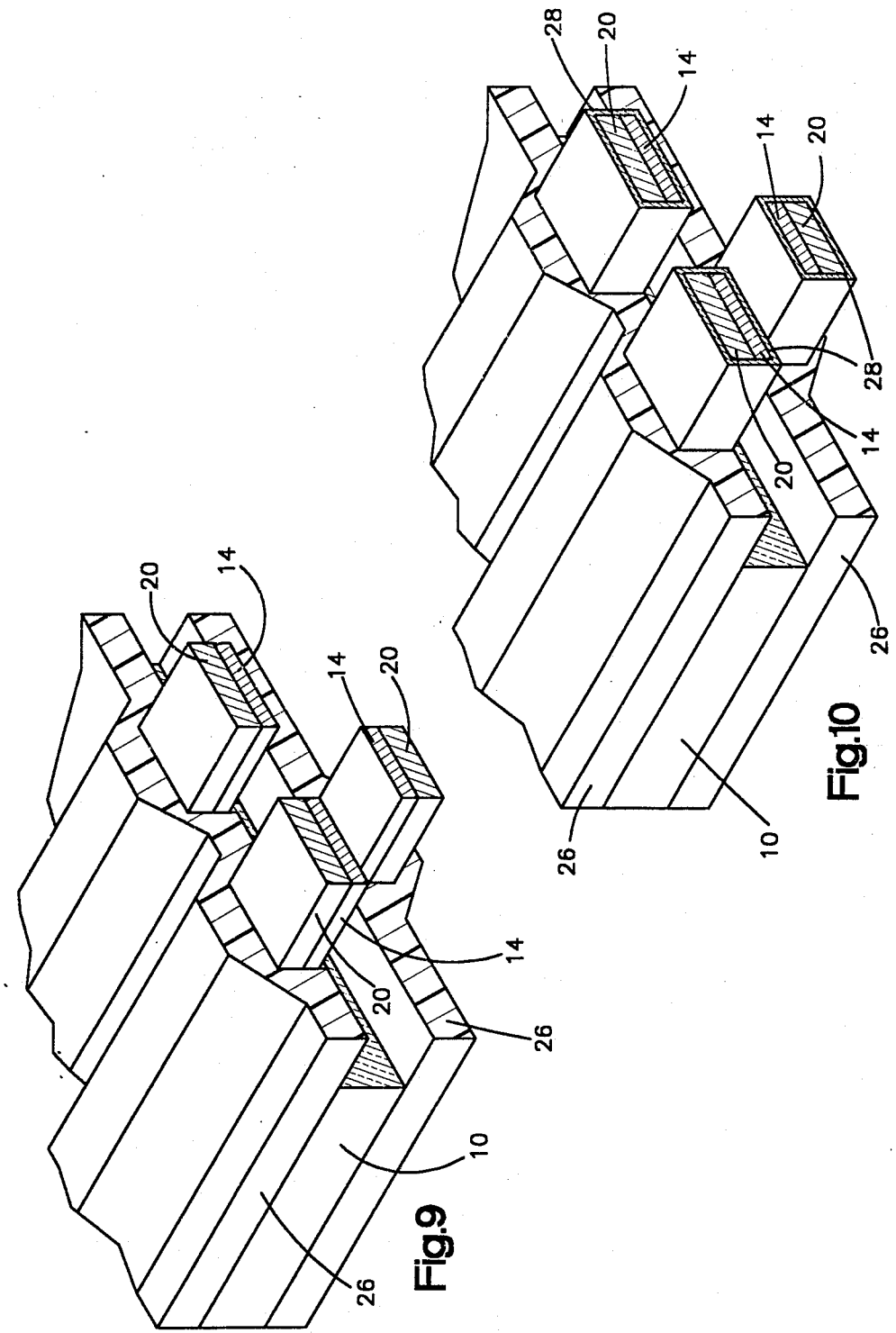

METHOD OF ETCHING POLYIMIDES AND RESULTING PASSIVATION STRUCTURE

BACKGROUND OF THE INVENTION

1. Field of the Invention

This invention relates generally to the etching and passivation of polyimide layers having metallization thereon, and more particularly to a process which allows photoimageable material to be utilized as a mask to reveal the desired pattern to be etched on a substrate and the same material to be used as a mask during the etching and also following the etching as a passivation material overlying the remaining polyimide substrate with the metallization layers thereon. It finds particular use in processes in which tape automated bonding (TAB) materials are manufactured in strip form.

2. Description of the Prior Art

Polyimide substrates with metallization layers thereon have found many different uses in the semiconductor industry. One particular use is for providing tape automatic bonding (TAB) structures which are comprised of a long ribbon of material having metallization in the form of lines extending on one side, and more recently on both sides thereof, for providing electrical connection to chips. In the manufacture of such TAB products, it is necessary to expose the metallization at various locations on the strips of material and indeed have lines extend beyond edges of the material so as to provide contacts for connection to pads on semi-conductor chips. It is further necessary to provide some type of passivation or protection layer over the metallized layer remaining on the tape and which does not extend beyond the ends thereof to provide the necessary protection to the metallization from the environment.

In the past, the construction of these polyimide substrates with metallization thereon has been performed in a number of different ways.

Typically the polyimide would be provided with metallized lines thereon and the polyimide substrate and metallized lines would be covered with some type of photoresist material which was patterned to reveal the portions of the polyimide which is to be removed. Several different types of photoresist have been used for this patterning but they have suffered from certain serious drawbacks. First a photoresist must be strong enough to resist the etchant used for the polyimide material which is a concentrated potassium hydroxide at temperatures in excess of 70° or 80° C. The photoresist must be sufficiently resistant during the etching process to prevent the potassium hydroxide from attacking the polyimide except at the exposed areas.

The photoresists that have had this property have conventionally been those which required removal by chlorinated solvents which require special handling as opposed to those that can be removed by nonchlorinated solvents. Further, while these photoresist materials that have been used have held up reasonably well during the etching process, they have not had the adherent properties necessary to remain in place after the etching in a bonded relationship over the substrate and metallization thereon to provide the necessary passivation. Hence, after the etching has been performed, it has been necessary to then strip the remaining photoresist and perform a separate step of applying passivating material to the substrate with the lines thereon. This problem is further exacerbated if the exposed or extending copper lines have to be further processed such as by gold plating which entails the necessary surface preparation followed by the plating operation.

Examples of prior art etching methods of the underlying polyimides are shown in U.S. Pat. Nos. 4,436,583; 3,833,436; 4,523,976; and 4,606,998. These patents are illustrative of various types of etching processes utilizing KFTR and other types of photoresists and lift-off processes as well as dry etch processes and the use of SiO2 which is patterned in certain types of operations involving other types of polyimide structures from those used for TAB. None of these patents disclose the process of the present invention.

SUMMARY OF THE INVENTION

According to the present invention, a method for selectively etching and passivating a polyimide substrate on which metallization has been applied in a preselected pattern is provided. The method includes applying over a metallized substrate a mask of photoimageable material which has the properties of resisting concentrated KOH etching when the material is cured and also the property of adhering to the polyimide substrate and the metallized pattern after exposure to the KOH etch to provide a passivation to the metallization. The process includes exposing said mask of photoimageable material to actinic radiation to selectively pattern the mask of material, developing said patterned mask material to reveal the underlying polyimide to be etched, curing the remaining mask material and etching the revealed polyimide material in concentrated KOH to remove the revealed polyimide material. The remaining mask material on the substrate is allowed to remain as a passivation material for the metallization which it covers. Optionally, also, exposed metallization may have a subsequent plating operation such as gold plating formed with the remaining masked material also acting as a protective and masking coating during the plating operation.

DESCRIPTION OF THE DRAWINGS

FIGS. 1 through 10 are perspective views somewhat diagrammatic depicting the various steps in the method of this invention of selectively etching and passivating a polyimide substrate with copper metallization thereon and plating gold on this exposed copper.

DESCRIPTION OF THE PREFERRED EMBODIMENT

Figures 5, 6:
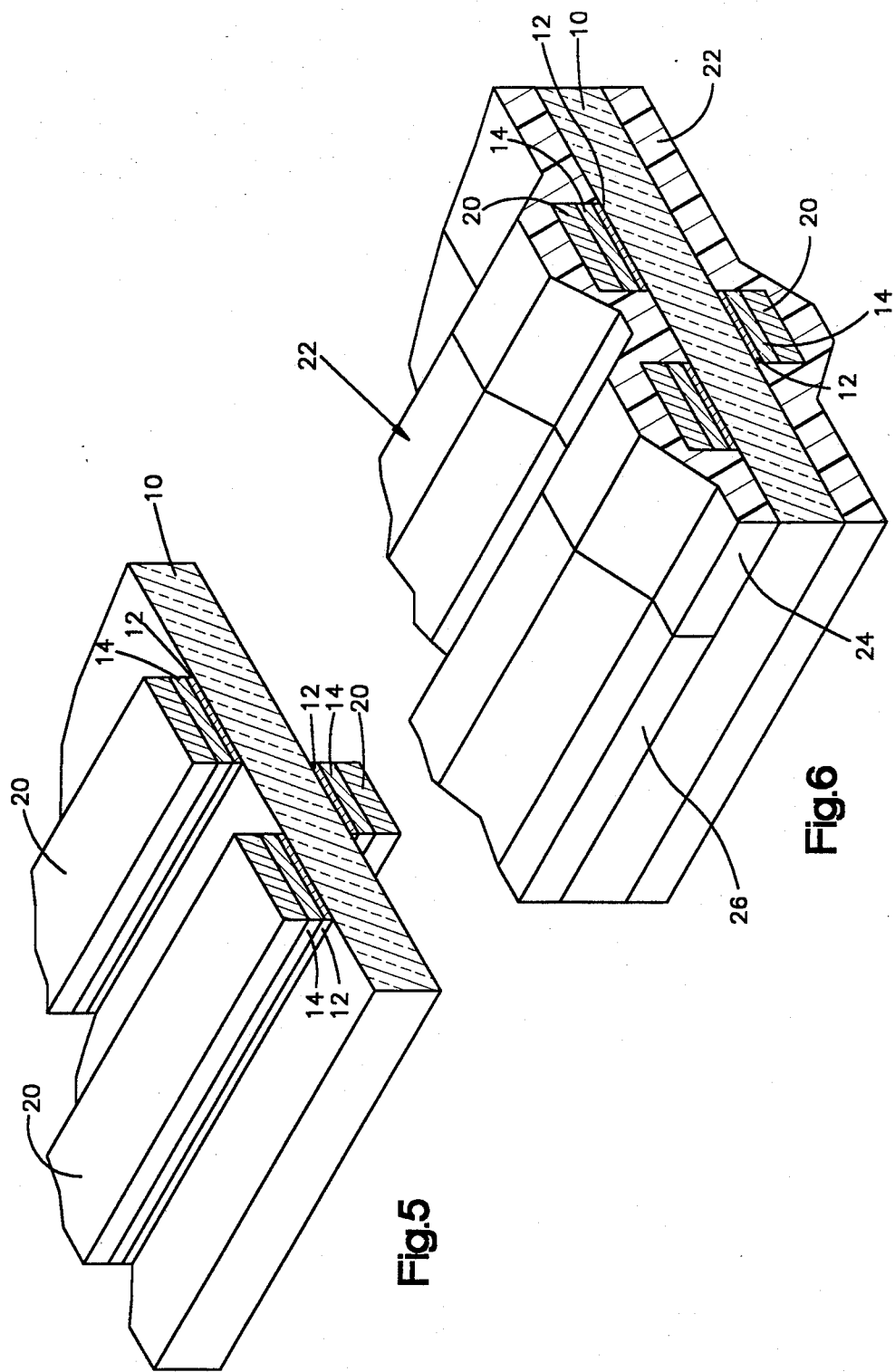

Referring now to the drawing the various figures show step-wise, and somewhat diagrammatically, the practice of the present invention of providing a method of selectively etching a polyimide material with a metallization layer formed thereon in a desired pattern and utilizing the material which is used for masking the substrate during the etching as a final passivation layer thus obviating the need for stripping of the mask and forming a separate passivation layer. The process of a final gold plating operation on this exposed metal is also shown.

As seen in FIG. 1, the starting material is a composite structure of a sheet of polyimide material 10 which preferably is a strip of material such as material sold under the trade mark Kapton by E.I. DuPont & Co. The polyimide material 10 has disposed on at least one side and preferably both sides, a thin seed layer comprised of a layer of chromium 12 deposited directly on the polyimide layer 10 and a layer of copper 14 deposited on top of the chromium. These two layers, 12 and 14 together, are no more than a few thousand angstroms thick and are applied in a conventional manner such as vacuum sputtering and do not per se constitute a portion of the invention.

In order to provide the required pattern of metallization, a layer of photoresist material 16 such as a negative photoresist sold by Dynachem of Tustin, Calif. (a Division of Morton Thiokol) as Laminar Brand aqueous resist type UF 1.5 mil is applied to the surface thereof and imagewise exposed and developed in a conventional manner such as in sodium carbonate to reveal the underlying copper layer 14, the revealed pattern having channels 18 disposed on both sides where the metallization is to be applied. This structure is shown in FIG. 2.

As shown in FIG. 3, copper 20 is deposited by electroplating in the channels 18 between the remaining strips of the photoresist material 16. Again, this copper plating technique is conventional in the prior art and need not be discussed. The remaining photoresist material 16 is then stripped to leave the structure shown in FIG. 4 which includes a series of copper lines 20 on each side of the substrate 10, the copper lines being deposited on the thin seed layer of chromium and copper 12, 14. The exposed seed layer of copper 14 and chromium 12 is then removed by a flash etch in two steps, for example the copper being removed in an etchant of sodium persulfate and the chromium being removed in an etchant of alkaline potassium permanganate. This will result in the structure shown in FIG. 5.

A layer of photoimageable epoxy resin 22 is applied over both sides of the substrate 10 with the metallization 20 thereon as shown in FIG. 6. This photoimageable material 22 will serve both as a mask to protect the underlying polyimide 10 for selective etching as will be described presently and also serve as a passivation layer overlying the remaining metallization after the etching has been completed. The preferred epoxy material for use as the photoimageable photo mask is shown and described in application U.S. Ser. No. 318,536, filed Mar. 3, 1989, entitled Improved Composition for Photo Imaging. It has been found that this material is extremely well suited for this particular purpose and serves excellently both as a masking material for the etchant and a passivation material afterwards and also if plating is done serves as a protective coating during the preparation for and plating operations such as gold plating. Broadly, the preferred material is a epoxy resin which consists essentially from about 10% to about 80% by weight of a polyol resin which is a condensation product of epichlorohydrin and bisphenol A having a molecular weight of between 40,000 and 130,000 and between 20% and 90% by weight of epoxidized octafunctional bisphenol A formaldehyde novolak resin having a molecular weight between about 4,000 and 10,000, and optionally, if flame retardancy is required, up to about 50% by weight of an epoxidized di-glycidyl ether of tetrabromo bisphenol A having a melting point of between about 90° C. and 110° C. and a molecular weight of between about 600 and 2500 and between about 0.1 to about 15 parts by weight of resin of a cationic photoinitiator capable of initiating polymerization of the epoxidized resin system upon exposure to radiation. A suitable polyol resin which is a condensation product of epichlorohydrin and bisphenol A is resin sold under the Trade Mark PKHC by Union Carbide Corporation. A suitable epoxidized octafunctional bisphenol A formaldehyde novolak resin is sold under the Trade Mark EpiRez SU-8 by High Tek Polymers, Inc., a suitable epoxidized di-glycidal ether of tetrabromo bisphenol A is sold under the Trade Mark EpiRez 5183 by High Tek Polymers Corporation, Inc. and a suitable photoinitiator is a complex triaryl sulfonium hexifluoroantimonate salt sold by General Electric Co. under the Trade Mark UVE1014. The material may also optionally contain up to about 10 parts by weight of a photosensitizer such as anthracene and perylene or their derivatives. These materials are discussed in detail in said application U.S. Ser. No. 318,536 and which application is specifically incorporated herein by reference as if it had been fully set out herein. The preferred resin is about 30% PKHC, about 45% EpiRez 5183 and about 25% SU-8 and about 5 parts by weight of UVE 1014 which is disclosed in said application U.S. Ser. No. 318,536. If desired, a surfactant, such as FC 430 sold by 3M Corporation can be added in amounts up to 1 part per 100 by weight. Also, various dyes such as Malachite Green, Ethyl violet, and Rhodamine B can be used in amounts up to about 1 part per 100 by weight.

The masking material may be coated onto the substrate 10 with metallization 20 in any desired manner. It may be curtain coated as described in said application U.S. Ser. No. 318,536. In such case, the formulation of example 4 thereof is the preferred formulation. This formulation has 30% PKHC, 45% EpiRez 5183 and 25% SU-8 with 5 parts per weight of UVE1014. As indicated in the application U.S. Ser. No. 318,536 this sample is mixed with a propylene glycol monomethyl ether acetate (PGMEA) solvent with a formulation of about 40% solids in the PGMEA. However, for many applications of the material it is desired to use spray application in which case this formulation is further diluted. It is preferred to further dilute this formulation with the solvent butyrolactone. The preferred mixture is 5 parts of the formulation of the resin in the PGMEA solvent to 2 parts butyrolactone. This will provide a solids content of about 32%.

The preferred process for applying the photoimageable material includes a surface treatment which includes a rinse in dilute aqueous HCl followed by a rinse in dilute aqueous carbonate followed by a benzotriazole rinse which will act to preserve the copper surface state. Following this the resin material is spray applied, first on one side and then dried in an oven between 80° and 90° C. for approximately 6-7 minutes. The process is then repeated on the second side. Material can be coated up to about 3 mils thick with preferred thickness being approximately 1.2 mils. Following the drying the solvent is removed by baking for a suitable time and temperature, preferably 140° C. for 30 minutes. The material is then ready to be masked and exposed to actinic radiation. The exposure is conventional and can be done at an energy of about 750 to 1,000 mJ/cm$^2$ per side. The material is a negative acting resist and hence the areas which are exposed are polymerized and become the mask and the unexposed areas will be developed and removed. The areas to be removed are shown in FIG. 6 designated by referenced character 24 and the areas to remain after exposure and development are designated by the referenced character 26.

The material is then baked at a temperature and time to sufficiently cure the material for developing. Preferred temperature and time is about 140° C. for about 30 minutes for the preferred thickness of about 1.2 mils. Any one of a number of types of developers can be used. The preferred developer is 100% butyrolactone with the part being immersed for sufficient time in the developer to fully develop the unexposed material, then in deionized water to rinse the part clean of developer. The preferred develop and rinse conditions for the preferred thickness of about 1.2 mils are about 1 minute immersion in butyrolactone, followed by about 1 minute in butyrolactone spray, followed by about a 1 minute spray water rinse, followed by about 1 minute radiant heat or hot air dry. This will remove the unexposed material and provide the structure as shown in FIG. 7. Following this, both sides of the remaining material are blanket exposed to at least 1,000 mJ/cm$^2$, preferably to 4,000 mJ/cm$^2$, followed by a final cure at about 110° to 180° C., preferably 150° C., for 30 minutes. This is the final cure of the material and results in a mask of material which is resistant to concentrated KOH which will be used to etch the polyimide material and also is a resistant material adhering firmly to both the copper lines and the polyimide material and resistant to attack by gold plating solutions.

The polyimide is then etched in a concentrated potassium hydroxide preferably about 7M, at elevated temperatures preferably about 85° C. Following the etching, the part is rinsed and then treated in hot sulfuric acid maintained at about 80° C. The sulfuric acid should be about 20% by volume. This is a very harsh process and this concentration and temperature of potassium hydroxide followed by a rinse in sulfuric acid tends to degrade most materials with which it comes in contact. However, it has been found, surprisingly, that the epoxy resin of this particular formulation is extremely resistant to the attack of both the potassium hydroxide and the sulfuric acid and remains firmly adherent to the polyimide substrate and the overlying metallization layer even after this very harsh and intrusive treatment, and the material remains on as a passivation layer when the polyimide has been etched to the structure shown in FIG. 8. As also can be seen in FIG. 8 with the potassium hydroxide etch, the etching is isotropic and provides some undercut.

The passivation layer is also useful in acting as a mask for a further gold plating operation in which the remaining seed layer 12 of chromium is stripped from the exposed surfaces of the copper layers 14, 20 and gold is plated thereon. This particular structure is used to form a contact member for bonding to chips.

The gold plating is performed by first removing the chromium 12 from the exposed copper which can be done in potassium permanganate and dilute sodium hydroxide solution, the resulting structure which is shown in FIG. 9, is given a surface preparation treatment in oxalic acid and the surface is then prepared by immersing the piece in sodium persulfate followed by a water rinse followed by an immersion in 10% sulfuric acid followed by another water rinse. Gold is then plated in a conventional manner on the exposed copper lines as shown in FIG. 10. Conventional gold plating solutions can be employed. One solution and process utilized a dibasic potassium phosphate, citric acid, and potassium gold cyanide bath for electrolytic plating of gold. The solution is typically of a strength of one troy ounce of gold per gallon solution equivalent and the plating current is typically about one ampere. The time in solution will dictate the gold thickness. If desired, a gold strike can be applied before the gold plating operation which is typically the same type of bath but the process is for a shorter period of time. This results in a product as shown in FIG. 10. It has been found also that the masking material withstands very well this gold plating treatment even when it is immersed in the various cleaning and gold plating solutions and remains firmly adherent and provides a passivation layer for the final product.

Thus, according to this invention, a single photoimageable epoxy resin is provided which acts both as a mask material for the highly intrusive etching of polyimide and the process of gold plating and remains after all of these intrusive processes as a firmly adhering passivation layer overlying both the polyimide and the metallization layer.

While one embodiment of this invention has been shown and described, various adaptations and modifications can be made without departing from the scope of the invention as defined in the appended claims.

What is claimed is:

1. A method for selectively etching a polyimide substrate on which metallization has been applied in a preselected pattern and passivating the metallization comprising, applying over said metallized substrate a mask of photoimageable material which has the properties of resisting concentrated KOH etching when cured and the property of adhering to the polyimide substrate and the metallized pattern after exposure to the KOH etch to provide a passivation layer for said metallization, exposing said mask material to actinic radiation to selectively pattern said mask material, developing said patterned mask material to reveal the underlying polyimide to be etched, curing the remaining masked material, etching the revealed polyimide material in concentrated KOH to remove the revealed polyimide material, and maintaining the remaining mask material on the substrate as a passivation material for the metallization which it covers.

2. The invention as defined in claim 1 further characterized by plating gold on at least a portion of the revealed metallization.

3. The invention as defined in claim 1 wherein said mask material consists essentially of from about 10% to about 80% by weight of a polyol resin which is a condensation product of epichlorohydrin and bisphenol A having a molecular weight of between about 40,000 and 130,000, and between about 20% and 90% by weight of an epoxidized octafunctional bisphenol A formaldehyde novolak resin, and between about 0.1 and about 15 parts by weight of resin of a cationic photoinitiator capable of initiating polymerization of the epoxidized resin system upon exposure to radiation.

4. The invention as defined in claim 3 further characterized by said mask material having up to about 50% by weight of an epoxidized di-glycidyl ether of tetrabromo bisphenol A, having a melting point between about 90° C. and 110° C. and a molecular weight of between about 600 and 2,500.

5. The invention as defined in claim 1 wherein said mask material is contained in a solvent; and said mask material in said solvent is spray coated onto said substrate.

6. The invention as defined in claim 1 wherein the mask material is about 30% by weight of the condensation product of epichlorohydrin and bisphenol A;

about 25% by weight the novolak resin; and about 45% by weight of the epoxidized diglycidyl ether of tetrabromo bisphenol A; and about 5 parts by weight of a complex triaryl sulfonium hexafluoroantimonate as the photoinitiator.

7. The invention as defined in claim 6 wherein said resins and photoinitiator are maintained in a solvent which is a mixture of propylene glycol monomethyl ether acetate and butyrolactone, and said solvent containing mask material is spray coated onto the substrate.

* * * * *